(12) United States Patent
Cha et al.

(10) Patent No.: US 11,088,102 B2
(45) Date of Patent: *Aug. 10, 2021

(54) BONDED STRUCTURES FOR PACKAGE AND SUBSTRATE

(71) Applicant: Taiwan Semiconductor Manufacturing Company, Ltd., Hsinchu (TW)

(72) Inventors: Ming-Hong Cha, Hsinchu (TW); Chen-Shien Chen, Zhubei (TW); Chen-Cheng Kuo, Chu-Pei (TW); Tsung-Hsien Chiang, Hsinchu (TW); Hao-Juin Liu, Kaohsiung (TW); Yao-Chun Chuang, Hsinchu (TW); Chita Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/673,479

(22) Filed: Nov. 4, 2019

(65) Prior Publication Data

US 2020/0098714 A1 Mar. 26, 2020

Related U.S. Application Data

(63) Continuation of application No. 15/615,341, filed on Jun. 6, 2017, now Pat. No. 10,468,366, which is a
(Continued)

(51) Int. Cl.
*H01L 23/00* (2006.01)
*H01L 23/498* (2006.01)
(Continued)

(52) U.S. Cl.
CPC ........ *H01L 24/17* (2013.01); *H01L 21/76897* (2013.01); *H01L 23/49811* (2013.01);
(Continued)

(58) Field of Classification Search
CPC ... H01L 21/76897; H01L 24/11; H01L 21/13; H01L 21/14; H01L 21/16; H01L 21/17;
(Continued)

(56) References Cited

U.S. PATENT DOCUMENTS 5,484,963 A 1/1996 Washino
5,591,941 A 1/1997 Acocella et al.
(Continued)

FOREIGN PATENT DOCUMENTS

CN 101582406 A 11/2009
CN 101636831 A 1/2010
(Continued)

*Primary Examiner* — David A Zaerneke
(74) *Attorney, Agent, or Firm* — Slater Matsil, LLP (57) ABSTRACT

The embodiments described provide elongated bonded structures near edges of packaged structures free of solder wetting on sides of copper posts substantially facing the center of the packaged structures. Solder wetting occurs on other sides of copper posts of these bonded structures. The elongated bonded structures are arranged in different arrangements and reduce the chance of shorting between neighboring bonded structures. In addition, the elongated bonded structures improve the reliability performance.

20 Claims, 7 Drawing Sheets

Related U.S. Application Data continuation of application No. 15/212,970, filed on Jul. 18, 2016, now Pat. No. 9,673,161, which is a continuation of application No. 14/840,811, filed on Aug. 31, 2015, now Pat. No. 9,397,059, which is a continuation of application No. 14/480,439, filed on Sep. 8, 2014, now Pat. No. 9,123,788, which is a continuation of application No. 13/667,306, filed on Nov. 2, 2012, now Pat. No. 8,829,673.

(60) Provisional application No. 61/684,565, filed on Aug. 17, 2012.

(51) Int. Cl.
*H01L 21/768* (2006.01)
*H01L 25/065* (2006.01)

(52) U.S. Cl.
CPC .. *H01L 23/49827* (2013.01); *H01L 23/49838* (2013.01); *H01L 24/11* (2013.01); *H01L 24/13* (2013.01); *H01L 24/14* (2013.01); *H01L 24/16* (2013.01); *H01L 24/81* (2013.01); *H01L 25/0657* (2013.01); *H01L 2224/02166* (2013.01); *H01L 2224/0401* (2013.01); *H01L 2224/05022* (2013.01); *H01L 2224/05124* (2013.01); *H01L 2224/05144* (2013.01); *H01L 2224/05147* (2013.01); *H01L 2224/05166* (2013.01); *H01L 2224/05181* (2013.01); *H01L 2224/05186* (2013.01); *H01L 2224/05552* (2013.01); *H01L 2224/05572* (2013.01); *H01L 2224/05647* (2013.01); *H01L 2224/05666* (2013.01); *H01L 2224/05681* (2013.01); *H01L 2224/05686* (2013.01); *H01L 2224/131* (2013.01); *H01L 2224/1301* (2013.01); *H01L 2224/13014* (2013.01); *H01L 2224/13022* (2013.01); *H01L 2224/1357* (2013.01); *H01L 2224/13082* (2013.01); *H01L 2224/13083* (2013.01); *H01L 2224/13124* (2013.01); *H01L 2224/13139* (2013.01); *H01L 2224/13144* (2013.01); *H01L 2224/13147* (2013.01); *H01L 2224/13166* (2013.01); *H01L 2224/13564* (2013.01); *H01L 2224/13601* (2013.01); *H01L 2224/141* (2013.01); *H01L 2224/145* (2013.01); *H01L 2224/14152* (2013.01); *H01L 2224/14154* (2013.01); *H01L 2224/14177* (2013.01); *H01L 2224/16237* (2013.01); *H01L 2224/16238* (2013.01); *H01L 2224/16505* (2013.01); *H01L 2224/171* (2013.01); *H01L 2224/17104* (2013.01); *H01L 2224/814* (2013.01); *H01L 2224/81143* (2013.01); *H01L 2224/81193* (2013.01); *H01L 2224/81194* (2013.01); *H01L 2224/81203* (2013.01); *H01L 2224/81385* (2013.01); *H01L 2224/81815* (2013.01); *H01L 2225/06513* (2013.01); *H01L 2924/00* (2013.01); *H01L 2924/00012* (2013.01); *H01L 2924/00014* (2013.01); *H01L 2924/014* (2013.01); *H01L 2924/01029* (2013.01); *H01L 2924/04941* (2013.01); *H01L 2924/04953* (2013.01); *H01L 2924/1305* (2013.01); *H01L 2924/13091* (2013.01); *H01L 2924/3511* (2013.01); *H01L 2924/3841* (2013.01)

(58) Field of Classification Search
CPC ............. H01L 21/81; H01L 2224/4154; H01L 2224/05647; H01L 2224/05666; H01L 2224/05681; H01L 2224/05686

See application file for complete search history.

(56) References Cited

U.S. PATENT DOCUMENTS

| | | |
|---|---|---|
| 5,859,474 A | 1/1999 | Dordi |
| 5,898,223 A | 4/1999 | Frye et al. |
| 6,181,569 B1 | 1/2001 | Chakravorty |
| 6,268,568 B1 | 7/2001 | Kim |
| 6,294,840 B1 | 9/2001 | McCormick |
| 6,339,534 B1 | 1/2002 | Coico et al. |
| 6,774,474 B1 | 8/2004 | Caletka et al. |
| 6,841,853 B2 | 1/2005 | Yamada |
| 6,841,875 B2 | 1/2005 | Ohsumi |
| 6,864,565 B1 | 3/2005 | Hool et al. |
| 6,913,948 B2 | 7/2005 | Caletka et al. |
| 6,927,498 B2 | 8/2005 | Huang et al. |
| 6,998,532 B2 | 2/2006 | Kawamoto et al. |
| 7,125,748 B2 | 10/2006 | Grigg et al. |
| 7,160,805 B1 | 1/2007 | Burke et al. |
| 7,397,121 B2 | 7/2008 | Chou et al. |
| 7,408,260 B2 | 8/2008 | Fjelstad et al. |
| 7,550,837 B2 | 6/2009 | Kimura et al. |
| 7,638,881 B2 | 12/2009 | Chang |
| 7,863,742 B2 | 1/2011 | Yu et al. |
| 7,872,344 B2 | 1/2011 | Fjelstad et al. |
| 7,893,524 B2 | 2/2011 | Sunohara et al. |
| 7,934,313 B1 | 5/2011 | Lin et al. |
| 8,084,871 B2 | 12/2011 | Rahim et al. |
| 8,119,927 B2 | 2/2012 | Yoda et al. |
| 8,178,392 B2 | 5/2012 | Choi et al. |
| 8,227,918 B2 | 7/2012 | Lu et al. |
| 8,227,926 B2 | 7/2012 | Topacio et al. |
| 8,232,641 B2 | 7/2012 | Ozawa et al. |
| 8,324,740 B2 | 12/2012 | Hagihara |
| 8,405,211 B2 | 3/2013 | Tsai et al. |
| 8,445,355 B2 | 5/2013 | Abou-Khalil et al. |
| 8,624,392 B2 | 1/2014 | Yew et al. |
| 8,820,612 B2 | 9/2014 | Feger et al. |
| 8,829,673 B2 * | 9/2014 | Cha .................. H01L 24/13 257/737 |
| 8,912,668 B2 | 12/2014 | Chen et al. |
| 9,123,788 B2 * | 9/2015 | Cha .................. H01L 24/11 |
| 9,224,680 B2 | 12/2015 | Chen et al. |
| 9,397,051 B2 * | 7/2016 | Uzoh ................. H01L 24/05 |
| 9,673,161 B2 * | 6/2017 | Cha .................. H01L 24/81 |
| 10,468,366 B2 * | 11/2019 | Cha .................. H01L 24/17 |
| 2002/0155637 A1 | 10/2002 | Lee |
| 2002/0164836 A1 | 11/2002 | Ho |
| 2003/0151140 A1 | 8/2003 | Nishiyama et al. |
| 2003/0222353 A1 | 12/2003 | Yamada |
| 2003/0227025 A1 | 12/2003 | Ochi et al. |
| 2004/0026782 A1 | 2/2004 | Anzai |
| 2004/0053483 A1 | 3/2004 | Nair et al. |
| 2004/0125577 A1 | 7/2004 | Vinciarelli et al. |
| 2004/0132230 A1 | 7/2004 | Kim |
| 2004/0212054 A1 | 10/2004 | Maxwell et al. |
| 2004/0227225 A1 | 11/2004 | Fjelstad et al. |
| 2005/0013082 A1 | 1/2005 | Kawamoto et al. |
| 2005/0087364 A1 | 4/2005 | Umemoto |
| 2005/0142835 A1 | 6/2005 | Ball et al. |
| 2005/0181545 A1 | 8/2005 | Grigg et al. |
| 2005/0242436 A1 | 11/2005 | Abe et al. |
| 2005/0253231 A1 | 11/2005 | Liu |
| 2006/0134830 A1 | 6/2006 | Frutschy et al. |
| 2006/0160346 A1 | 7/2006 | Hori |
| 2007/0069346 A1 | 3/2007 | Lin et al. |
| 2007/0148951 A1 | 6/2007 | Pang et al. |
| 2007/0200239 A1 | 8/2007 | Su |
| 2008/0102620 A1 | 5/2008 | Sakaguchi |
| 2008/0116588 A1 | 5/2008 | Van Kleef et al. |
| 2008/0142994 A1 | 6/2008 | Lu et al. |
| 2008/0182398 A1 | 7/2008 | Carpenter et al. |
| 2008/0265413 A1 | 10/2008 | Chou et al. |
| 2008/0283998 A1 | 11/2008 | Choi et al. |

(56) References Cited

U.S. PATENT DOCUMENTS

| | | |
|---|---|---|
| 2008/0298034 A1 | 12/2008 | Park et al. |
| 2008/0308934 A1 | 12/2008 | Alvarado et al. |
| 2009/0014869 A1 | 1/2009 | Vrtis et al. |
| 2009/0096079 A1 | 4/2009 | Park |
| 2009/0152721 A1 | 6/2009 | Huang et al. |
| 2009/0174084 A1 | 7/2009 | Jadhav et al. |
| 2009/0283903 A1 | 11/2009 | Park |
| 2010/0117231 A1 | 5/2010 | Lang et al. |
| 2010/0237491 A1 | 9/2010 | Park et al. |
| 2010/0237506 A1 | 9/2010 | Brunnbauer et al. |
| 2010/0283148 A1 | 11/2010 | Tsai et al. |
| 2011/0074041 A1 | 3/2011 | Leung et al. |
| 2011/0095415 A1 | 4/2011 | Topacio et al. |
| 2011/0101519 A1 | 5/2011 | Hsiao et al. |
| 2011/0101526 A1 | 5/2011 | Hsiao et al. |
| 2011/0198753 A1 | 8/2011 | Holland |
| 2011/0227216 A1 | 9/2011 | Tseng et al. |
| 2011/0228464 A1 | 9/2011 | Guzek et al. |
| 2011/0248398 A1 | 10/2011 | Parvarandeh et al. |
| 2011/0254154 A1 | 10/2011 | Topacio et al. |
| 2011/0285023 A1 | 11/2011 | Shen et al. |
| 2012/0032322 A1 | 2/2012 | Lin et al. |
| 2012/0032337 A1 | 2/2012 | Lu et al. |
| 2012/0049343 A1 | 3/2012 | Schulze et al. |
| 2012/0086123 A1 | 4/2012 | Park et al. |
| 2012/0098120 A1 | 4/2012 | Yu et al. |
| 2012/0153329 A1 | 6/2012 | Cho |
| 2012/0193778 A1 | 8/2012 | Mawatari |
| 2012/0205813 A1 | 8/2012 | Lin et al. |
| 2012/0228765 A1 | 9/2012 | Alvarado et al. |
| 2013/0026622 A1 | 1/2013 | Chuang et al. |
| 2013/0062741 A1 | 3/2013 | Wu et al. |
| 2013/0062755 A1 | 3/2013 | Kuo et al. |
| 2013/0087892 A1 | 4/2013 | Yew et al. |
| 2013/0093079 A1 | 4/2013 | Tu et al. |
| 2013/0147030 A1 | 6/2013 | Chang et al. |
| 2013/0221522 A1 | 8/2013 | Chen et al. |
| 2013/0228897 A1 | 9/2013 | Chen et al. |
| 2014/0035148 A1 | 2/2014 | Chuang et al. |
| 2014/0048929 A1 | 2/2014 | Cha et al. |
| 2014/0113447 A1 | 4/2014 | Yew et al. |
| 2015/0235976 A1 | 8/2015 | Yew et al. |
| 2016/0064347 A1 | 3/2016 | Kuo et al. |
| 2016/0111363 A1 | 4/2016 | Chen et al. |

FOREIGN PATENT DOCUMENTS

| | | |
|---|---|---|
| EP | 1107306 A1 | 6/2001 |
| JP | 02170548 A | 7/1990 |
| JP | 11145199 A | 5/1999 |
| JP | 2002280487 A | 9/2002 |
| KR | 1020100104377 A | 9/2010 |
| TW | 201009963 A | 3/2010 |
| WO | 2006008701 A2 | 1/2006 |

\* cited by examiner

BONDED STRUCTURES FOR PACKAGE AND SUBSTRATE

This application is a continuation of U.S. patent application Ser. No. 15/615,341, filed on Jun. 6, 2017, and entitled "Bonded Structures for Package and Substrate," which application is a continuation of U.S. patent application Ser. No. 15/212,970, filed on Jul. 18, 2016, and entitled "Bonded Structures for Package and Substrate," now U.S. Pat. No. 9,673,161, issued on Jun. 6, 2017, which is a continuation of U.S. patent application Ser. No. 14/840,811, filed on Aug. 31, 2015, and entitled, "Bonded Structures for Package Substrate," now U.S. Pat. No. 9,397,059, issued on Jul. 19, 2016, which is a continuation of U.S. patent application Ser. No. 14/480,439, filed on Sep. 8, 2014, and entitled "Bonded Structures for Package and Substrate," now U.S. Pat. No. 9,123,788, issued on Sep. 1, 2015, which is a continuation of U.S. patent application Ser. No. 13/667,306, filed on Nov. 2, 2012, and entitled "Bonded Structures for Package and Substrate," now U.S. Pat. No. 8,829,673, issued on Sep. 9, 2014, which claims the benefit of the following provisionally filed U.S. Patent application: Application Ser. No. 61/684,565, filed Aug. 17, 2012, and entitled "Bonded Structures for Package and Substrate," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less areas or smaller heights than packages of the past, in some applications.

Thus, new packaging technologies have begun to be developed. These relatively new types of packaging technologies for semiconductor devices face manufacturing challenges.

BRIEF DESCRIPTION OF THE DRAWINGS

For a more complete understanding of the present disclosure, and some advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative and do not limit the scope of the disclosure.

Figure 1A:
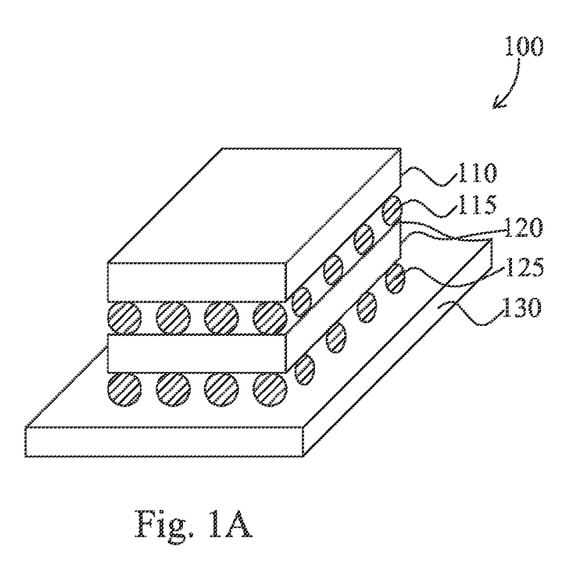
FIG. 1A is a perspective view of a package structure in accordance with some embodiments.

FIG. 1A is a perspective view of a package structure 100 including a package 110 bonded to a substrate (or bonding substrate) 120, which is further bonded to another substrate 130 in accordance with some embodiments. Package 110 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O)

device, system-on-chip (SoC) device, combinations thereof, and other suitable types of devices.

Substrate 120 includes a portion of semiconductor wafer, in accordance with some embodiments. Substrate 120 may include silicon, gallium arsenide, silicon-on-insulator ("SOI") or other similar materials. In some embodiments, substrate 120 also includes passive devices such as resistors, capacitors, inductors and the like, or active devices such as transistors. In some embodiments, substrate 120 includes additional integrated circuits. Substrate 120 may further include through substrate vias (TSVs) and may be an interposer. Substrate 120 may be a packaged die, in accordance with some embodiments. In some embodiments, substrate 130 includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Substrate 130 may be made of materials that are used to make substrate 120. In some embodiments, substrate 130 is a multiple-layer circuit board. Package 110 is bonded to substrate 120 via connectors 115, and substrate 120 is bonded to substrate 130 via connectors 125.

Figure 1B:
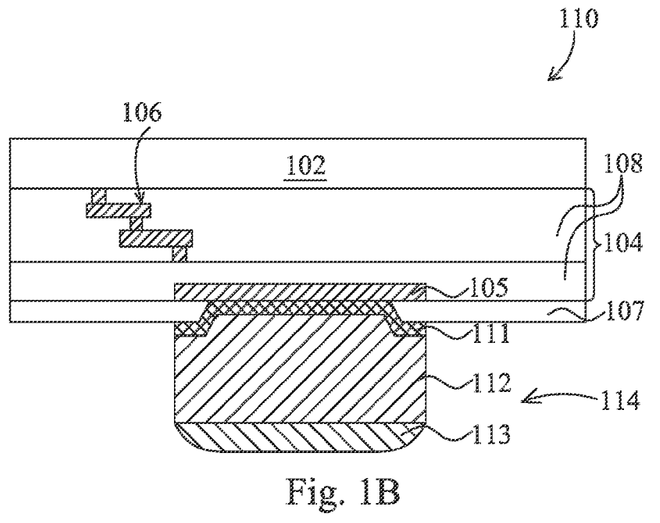
FIG. 1B illustrates a cross-sectional view of a portion of package, in accordance with some embodiments.
Figure 1C:
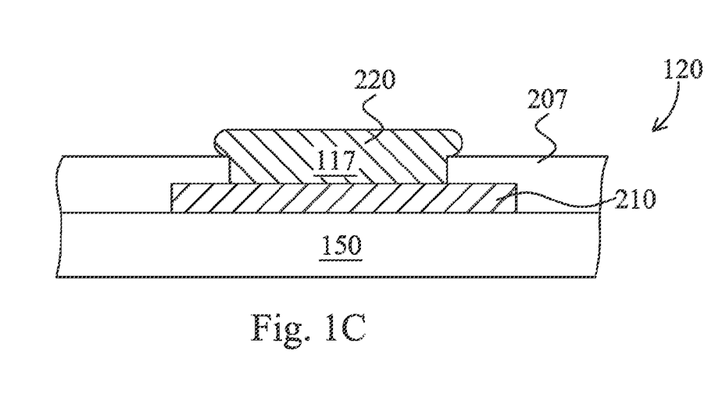
FIG. 1C illustrates a cross-sectional view of a portion of a substrate, in accordance with some embodiments.

FIGS. 1B and 1C illustrate a cross-sectional view of a portion of package 110 and a portion of substrate 120 near bonding structures before they are bonded together, in accordance with some embodiments. FIG. 1B shows that Package 110 includes a substrate 102 with devices (not shown) with interconnect formed therein. As mentioned above, substrate 102 may include a semiconductor substrate such as a silicon substrate, although it may include other semiconductor materials. Interconnect structure 104, which includes metal lines and vias 106 formed therein and connected to the semiconductor devices, is formed on substrate 102. Metal lines and vias 106 may be formed of copper or copper alloys, and may be formed using damascene processes. Interconnect structure 104 may include a commonly known inter-layer dielectric (ILD, not shown) and inter-metal dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5.

Package 110 includes under-bump metallurgy (UBM) layer 111 and a copper post 112 on UBM layer 111. Throughout the description, the copper post 112 is also referred to as a copper-containing bump or metal bump. Although copper post 112 is used as an example in the description here and below, other types of metal bumps, such as solder bumps, may also be used in place of copper post 112. A solder layer 113 is formed over the copper post 112, in accordance with some embodiments. In some embodiments, a solder layer is not formed over the copper post 112. In some embodiments, a metal barrier layer (not shown) is formed between copper post 112 and solder layer 113 to prevent the formation of inter-metallic compound (IMC) formed by mixing of solder and copper. In some embodiments, the barrier layer is made of Ti. The metal barrier layer is not formed in some embodiments. The UBM layer 111 is disposed on a metal pad 105, which is connected to the interconnect structure in package 110. Between the interconnect structure 104 and a portion of the UBM layer 111 not contacting the metal pad 105, there is a passivation layer 107. In some embodiments, the passivation layer 107 is made of polyimide. In some embodiments, passivation layer 107 includes more than one sub-layer. Metal pad 105 may be connected to input/output structures or other conductive structures on the same metal level through metal lines. In some embodiments, metal pad 105 includes copper and can be pure copper or a copper alloy. In some alternative embodiments, other conductive materials are used instead of copper. For example, metal pad 105 may include aluminum, aluminum alloy, gold, or gold alloy, etc.

In some embodiments, UBM layer 111 includes a diffusion barrier layer and a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The copper seed layer may be formed of copper or one of copper alloys that include silver, chromium, nickel, tin, gold, and combinations thereof. In some embodiments, the UBM layer 111 includes a diffusion barrier layer formed of Ti and a seed layer formed of Cu. The UBM layer 111, copper post 112 and solder layer 113 form a bump structure 114, in accordance with some embodiments. In some other embodiments, copper post 112 can be replaced with another type of conductive materials, such as aluminum, gold, silver, alloy thereof, etc.

FIG. 1C shows a substrate 120 including a base substrate 150, in accordance with some embodiments. Substrate 120 includes metal lines and vias connecting metal features on opposite sides of substrate 120. The vias of substrate 120 may include plating through holes (PTHs), which are filled with conductive metal(s). Substrate 120 also includes a metal pad 210, which is partially covered by a passivation layer 207. In some embodiments, the passivation layer 207 is a solder resist, which can be patterned by lithography without another photoresist layer. Metal pad 210 may be electrically connected to a ball grid array (BGA) ball (not shown) on the bottom side of substrate 120 through metal lines and vias (not shown). The metal lines and vias are formed in dielectric layers, which may be formed over a semiconductor layer.

Metal pad 210 is formed over a top dielectric layer. Metal pad 210 may be formed of substantially pure copper, aluminum copper, or other metallic materials such as tungsten, nickel, palladium, gold, and/or alloys thereof. Metal pad 210 is partially covered by a passivation layer 207. A solder layer 220 is formed over the metal pad 210 to fill opening formed in the passivation layer 107 to bonding with the solder layer 113 or copper post 112 (if there is no solder layer 113) of package 110. In some embodiments, the opening formed in the passivation layer 107 is called a solder resist opening (SRO) 117. Metal pad 210 may be connected to input/output structures or other conductive structures on the same metal level through metal lines. In some embodiments, metal pad 210 includes copper and can be pure copper or a copper alloy. In some alternative embodiments, other conductive materials are used instead of copper. For example, metal pad 210 may include aluminum, aluminum alloy, gold, or gold alloy, etc. Details of an exemplary mechanism for forming substrate 120 is described in U.S. patent application Ser. No. 12/852,196, titled "Flip Chip Substrate Package Assembly and Process for Making Same", and filed on Aug. 6, 2010, which is incorporated by reference herein for its entirety.

Figure 1D:
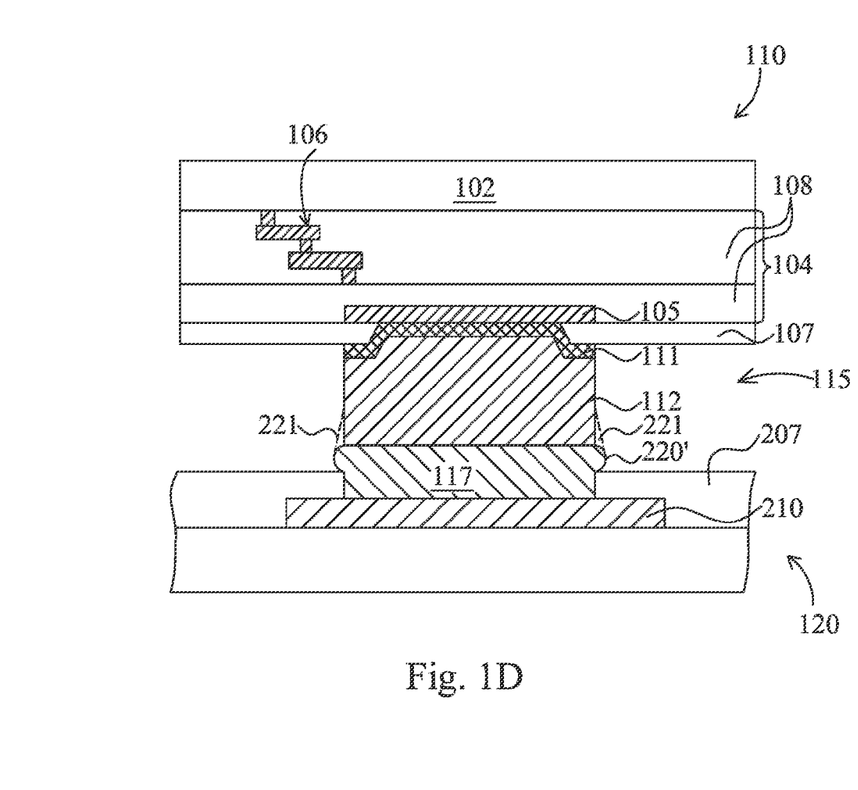
FIG. 1D shows a bonded structure, in accordance with some embodiments.

To bond package 110 to substrate 120, package 110 is pressed against substrate 120 with bump structures 114 aligned with solder layer 220 over SROs 117. A reflow process is then applied to melt the solder layer 113 on bump structures 114 with solder layer 220. FIG. 1D shows a bonded structure (or bonding structure) 115 after solder layer 113 is bonded to solder layer 220, in accordance with some embodiments. FIG. 1D shows that the combined solder layer 220' extends beyond the boundary of copper post 112, in accordance with some embodiments. Sometimes, a portion of solder layer 220' could creep along and cover a portion of the side walls of copper posts 114, which is called sidewall wetting, shown by the dotted lines 221.

Figure 2A:
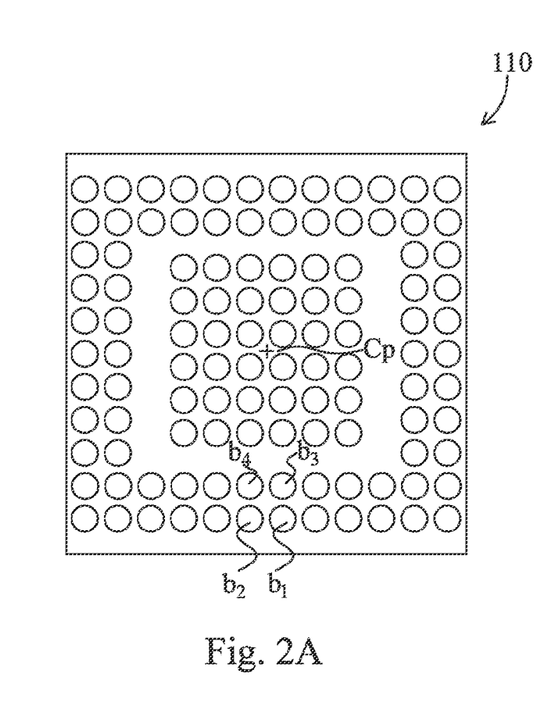
FIG. 2A shows a bottom view of package with a number of bump structures, in accordance with some embodiments.

FIG. 2A shows a bottom view of package 110 with a number of bump structures 114, in accordance with some embodiments. FIG. 2A shows that bump structures 114 have circular cross-sectional views. In addition, bump structures 114 in the central region (or region I) have more space between them than bump structures 114 in the edge region (or region II). The pitch of bumps structures 114 in region I is larger than the pitch of bumps in region II. As described above, package 110 is bonded to substrate 120. There are SROs 117 on substrate 120, which are filled with solder layer 220, arranged in a pattern matching the pattern of bump structures 114 on package 120.

Due to different coefficients of thermal expansion (CTE) between materials in package 110 and substrate 120, their relative positions can shift after thermal treatment, such as reflow. For example, package 110 include silicon substrate and has an overall CTE about 2-3 ppm/° C., which is lower than the overall CTE of substrate 120, which is about 17 ppm/° C. After thermal treatment, substrate 120 would expand more than package 110 both horizontally and vertically, which causes the shifting of their relative positions. The shifting of their relative positions is most prominent at the edges than centers of package 110 (Cp) and substrate 120. Shifting of their relative positions is minimal near the center of the bonded package (110/120).

Figure 2B:
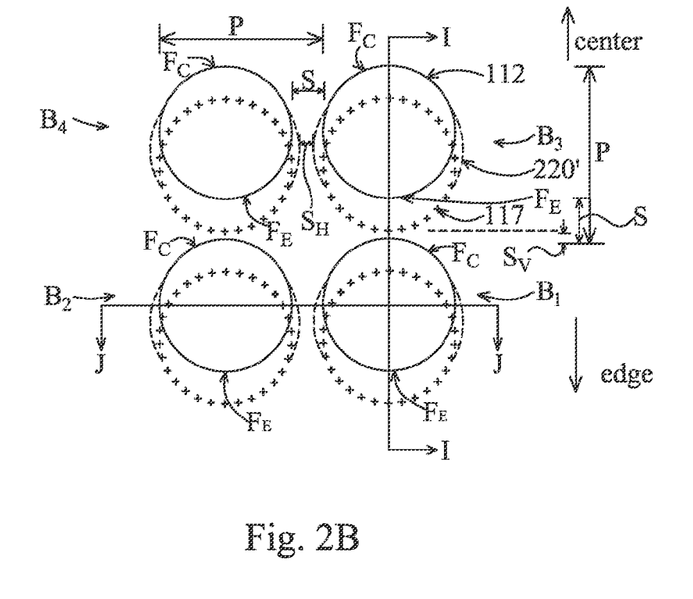
FIG. 2B shows enlarged top view of 4 neighboring bonded structures, in accordance with some embodiments.

FIG. 2B shows enlarged top view of neighboring bonded structures 115, $B_1$, $B_2$, $B_3$, and $B_4$, near the edge of the bonded package (110/120), in accordance with some embodiments. The solid circles in FIG. 2B are outlines of copper posts 112 and the dotted circles are outlines of solder layer 220'. The copper posts 112 associated with bonded structures 115, $B_1$, $B_2$, $B_3$, and $B_4$, are shown as $b_1$, $b_2$, $b_3$, and $b_4$ respectively in FIG. 2A. The circles marked by "+" signs are outlines of SROs 117. In the embodiment shown in FIG. 2B, the diameter of SROs 117 is about the same as the diameter of copper posts 112. However, the diameter of SROs 117 could be larger or smaller than the diameter of copper posts 112. FIG. 2B shows that the pitch of the copper posts 112 (and SROs 117) is P and the space between them is S. In some embodiments, P is equal to or greater than about 40 μm. In some embodiments, P is in a range from 40 μm to about 200 μm. In some embodiments, S is equal to or greater than about 20 μm. In some embodiments, S is in a range from 20 μm to about 150 μm.

Figure 2C:
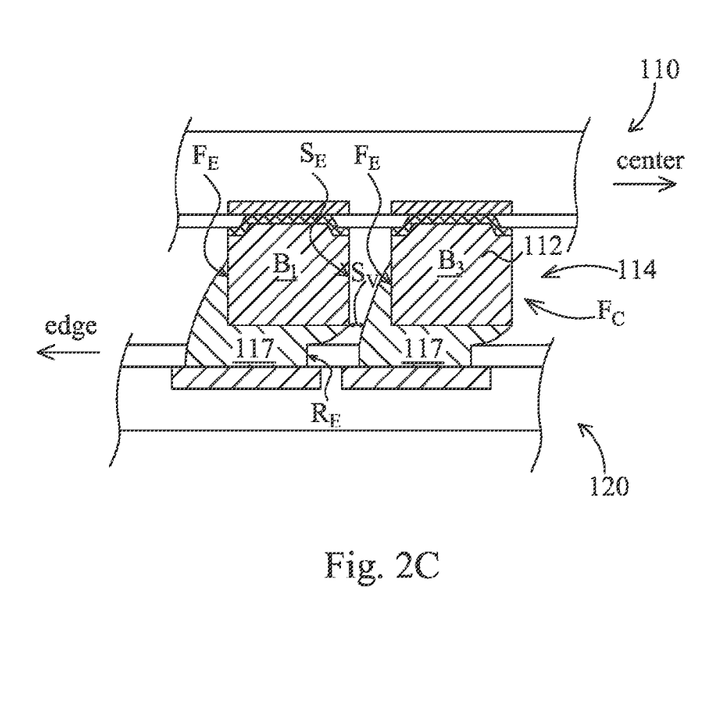
FIG. 2C shows a cross-sectional view of two neighboring bonded structures, in accordance with some embodiments.

Due to higher CTE of substrate 120 in comparison to package 110, edges of substrate 120 shifted outward more than the edges of package 110. FIG. 2B shows that SROs 117 have shifted more towards edges of the bonded package (110/120) than copper posts 112 after thermal treatment (or reflow). Prior to thermal treatment, the solid outlines of copper posts 112 should substantially match (or overlap) the outlines (marked by "+" signs) of SROs 117 with their centers substantially overlapping. Due to shifting of the relative positions of copper posts 112 and corresponding SROs 117, the solder layer 220' between them is also shifted towards the edges. FIG. 2C shows a cross-sectional view of bonded structures 115, $B_1$ and $B_3$, cut along an imaginary line II, in accordance with some embodiments. FIG. 2C shows that the SROs 117 of $B_1$ and $B_3$ are shifted more towards the edge than copper posts 112 of copper posts 112 on package 110. Due to the shifting, the surface regions, $F_C$, of copper posts 112 facing center of bonded package are not wetted by solder layer 220'. In contrast, the surface regions, $F_E$, of copper posts 112 facing the edge, are wetted by solder layer 220'. FIG. 2C also shows that the edges, $S_E$, of copper post 112 extend beyond the edges, $R_E$, of SROs 117. As a result, the distance between bonded structures 115, $B_1$ and $B_3$, is shorted to $S_V$, which is shorter than S.

Figure 2D:
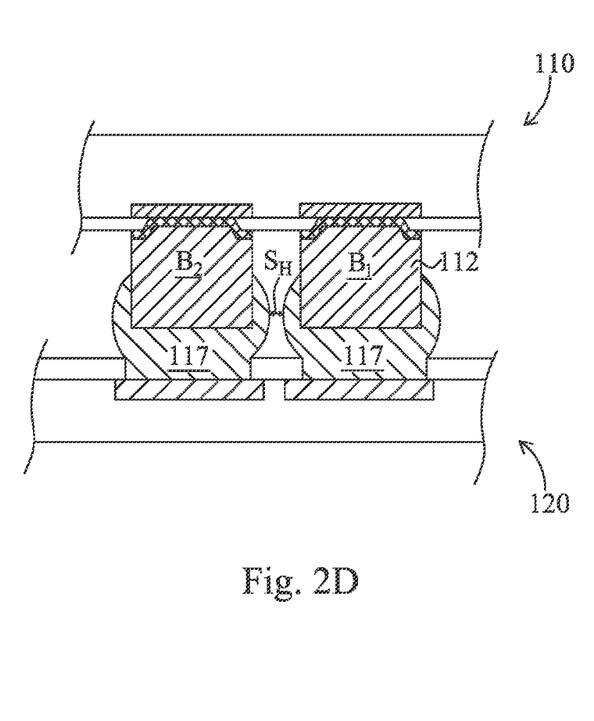
FIG. 2D shows another cross-sectional view of two neighboring bonded structures, in accordance with some embodiments.

FIG. 2D shows a cross-sectional view of bonded structures 115, $B_1$ and $B_2$, cut along an imaginary line JJ, in accordance with some embodiments. FIG. 2D shows that the protruding solder layer 220' between bonded structures 115, $B_1$ and $B_2$, shortens the space between them to $S_H$. Sometimes, the solder layer 220' between bonded structures 115, $B_1$ and $B_2$, is shorted to each other, which lowers the yield of the packaged structure.

Figure 3A:
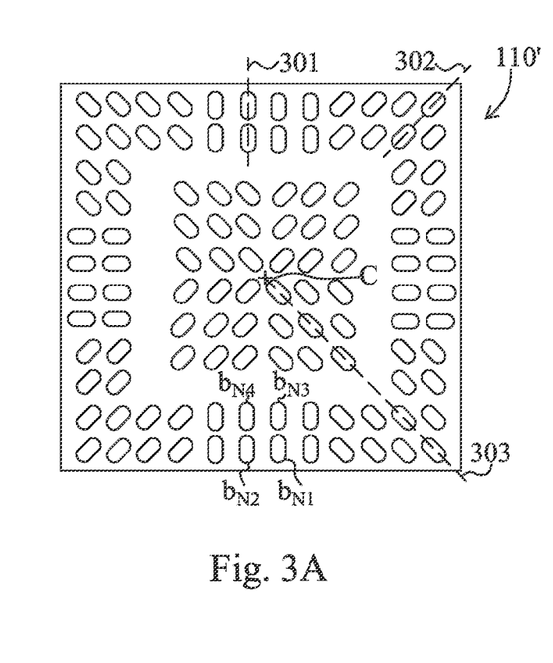
FIG. 3A shows a bottom view of package with a number of bump structures, in accordance with some embodiments.

FIG. 3A shows a bottom view of package 110' with a number of bump structures 114', in accordance with some embodiments. FIG. 3A shows that bump structures 114' have elongated cross sections, which could be shaped in race tracks, ovals, etc. FIG. 3A show that the axes, such as axes 301, 302, and 303, of the bump structures 114' are substantially pointing toward the center "C" of package 110'. The SROs of a substrate (not shown), which is similar to substrate 120, are also designed to have outlines and orientations matching the bump structures 114', which would bond with the solder layer filling the SROs. Such placement of the axes of the bump structures 114' and SROs on the substrate substantially pointing to the center "C" is designed to reduce stress caused by the thermal cycle(s) during bonding process. The thermal cycle(s) would cause the package and the substrate to expand outward in all directions from the centers of the package and the substrate.

Figure 3B:
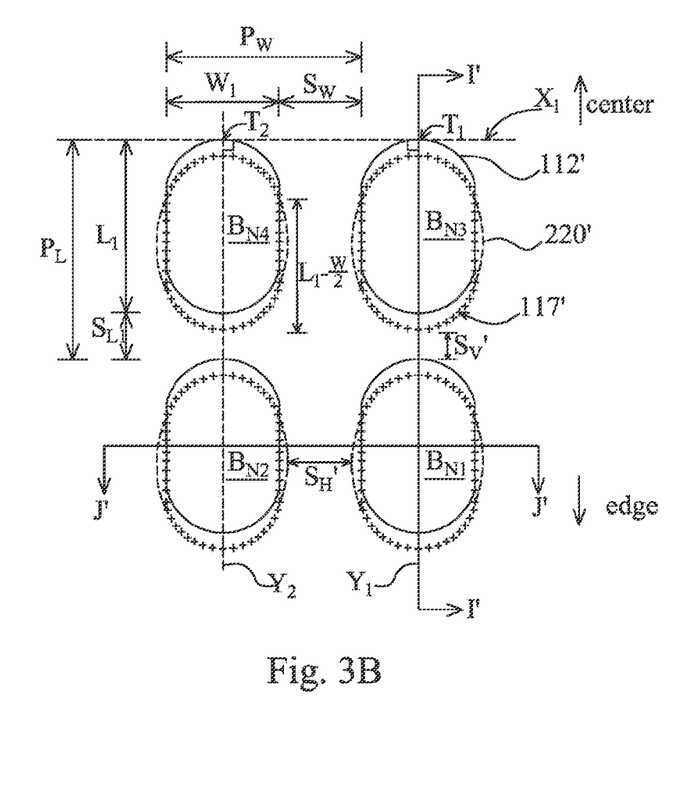
FIG. 3B shows a top view of four neighboring bonded structures, in accordance with some embodiments.

FIG. 3B shows a top view of 4 neighboring bonded structures 115', $B_{N1}$, $B_{N2}$, $B_{N3}$, and $B_{N4}$, in accordance with some embodiments. The bump structures 114', $b_{N1}$, $b_{N2}$, $b_{N3}$, and $b_{N4}$ in FIG. 3A correlate to bonded structures 115', $B_{N1}$, $B_{N2}$, $B_{N3}$, and $B_{N4}$ respectively. FIG. 3B shows the outlines of copper posts 112', the outlines of SROs 117' with "+" signs, and also the dotted outlines of solder layers 220' of these bonded structures 115'. Prior to thermal cycle(s), the outlines of bonded structures 115' substantially match (or overlap) with the outlines of SRO 117'. Due to difference in CTEs between package 110' and substrate 120', the edges of substrate 120' shifted more outward than the edges of package 110'. Therefore, the outlines of SRO 117' are shifted more toward the edge(s) than the outlines of copper posts 112', especially for bond structures 115' near the edge, such as $B_{N1}$, $B_{N2}$, $B_{N3}$, and $B_{N4}$. FIG. 3B shows that the width of copper posts 112' is W and the length is L. L is larger than W. In some embodiments, L/W is in a range from about 1.1 to about 2.0. In some embodiments, L/W is in a range from about 1.2 to about 1.5. The copper posts 112' are shaped in race tracks with a half circle on each end. Due to the difference in relative shifting of the copper posts 112' and SROs 117', the lengths of copper post sidewalls that are wetted (by solder layer 220') are equal to or less than about L−W/2, in accordance with some embodiments. The solder 220', which is a mixture of solder layer 220 filling a SRO 117' and a solder layer 113' of a bump structure 114', is pulled toward the edge of the package structure 110'/120'.

The elongated cross-sectional views of copper posts 112' and SROs 117 shown in FIG. 3B are shaped like race tracks. However, other types of elongated cross-sectional views are also possible, such as ovals, rounded rectangles, etc.

Figure 3C:
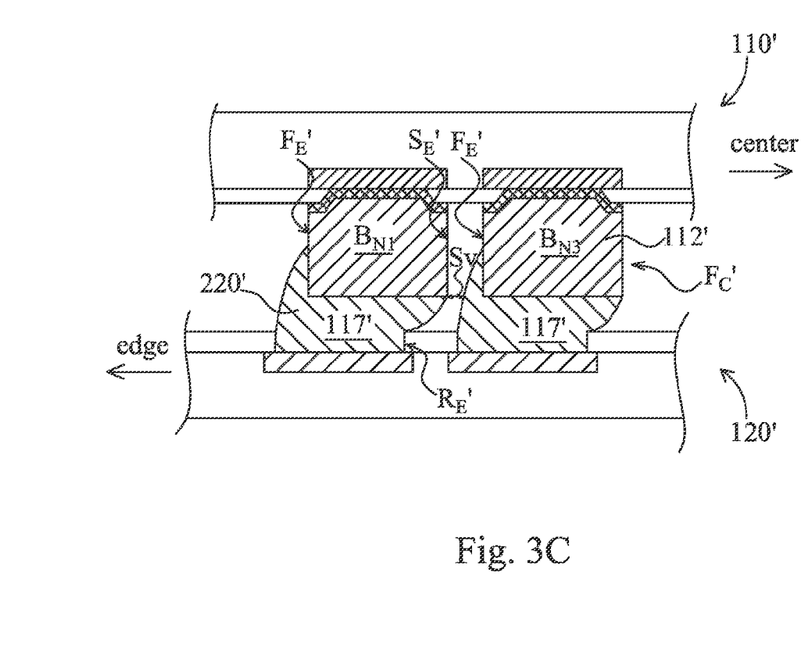
FIG. 3C shows a cross-sectional view of two neighboring bonded structures, in accordance with some embodiments.

FIG. 3C shows a cross-sectional view of bonded structures 115' $B_{N3}$ and $B_{N1}$ cut along an imaginary line I'I', in accordance with some embodiments. FIG. 3C shows that the SROs 117' of $B_{N1}$ and $B_{N3}$ are shifted more towards the edge than copper posts 114' of bump structure 114' on package 110'. Due to the shifting, the front surface regions, $F_c'$, of copper posts 112' facing center of bonded package are not wetted by solder layer 220'. In contrast, the back surface regions, $F_E'$, of copper posts 112' facing the edge, are wetted by solder layer 220'. FIG. 3C also shows that the edges, $S_E'$, of solder layer 220' extend beyond the edges, $R_E'$, of SROs 117. In addition, the distance between bonded structures 115', $B_{N1}$ and $B_{N3}$, is shorted to $S_V'$.

Figure 3D:
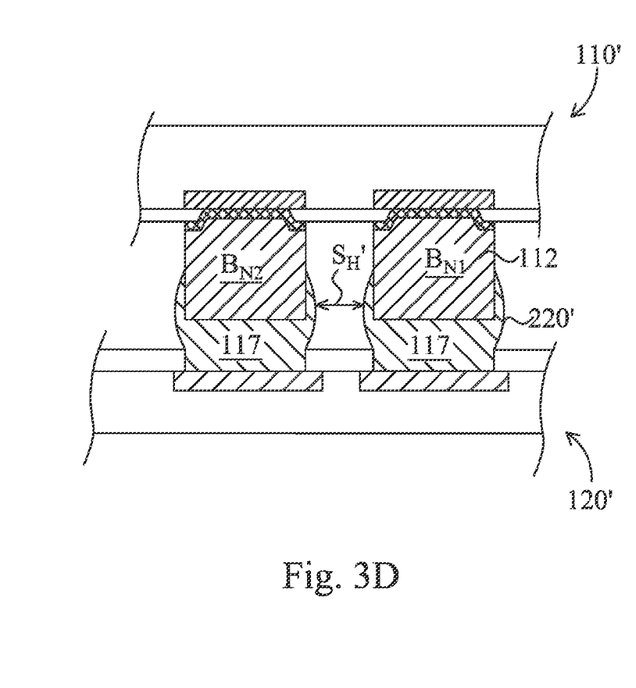
FIG. 3D shows a cross-sectional view of two neighboring bonded structures, in accordance with some embodiments.

FIG. 3D shows a cross-sectional view of bonded structures 115', $B_{N1}$ and $B_{N2}$, cut along an imaginary line J'J', in accordance with some embodiments. FIG. 3D shows that the protruding solder layer 220' between bonded structures 115', $B_{N1}$ and $B_{N2}$, shortens the space between them to $S_H'$.

FIG. 3B shows that the 4 neighboring bonded structures 115' with copper posts 112' having a pitch $P_W$ and a space $S_W$ measured along the widths of these structures. In addition, the 4 neighboring bonded structures 115' have copper posts 112' with a pitch $P_L$ and a space $S_L$ measured along the width of these structures. Due to the protruding solder layer 220', with space between structure $B_{N1}$ and $B_{N2}$ is reduced to $S_H'$. If pitch $P_W$ is maintained to be equal to P of FIG. 2B, space $S_W$ is larger than S of FIG. 2B. As a result, space $S_H'$ is larger than $S_H$ and the neighboring bonded structures 115', such as $B_{N1}$ and $B_{N2}$, are less likely to short to each other.

Similarly, due to the protruding solder layer 220', with space between structure $B_{N1}$ and $B_{N3}$ is reduced to $S_V'$. If pitch $P_L$ is maintained to be equal to P of FIG. 2B, space $S_L$ is smaller than S of FIG. 2B. However, since the protrusion of the solder layer 220' only occurs on the edge-sides of copper posts, not the sides pointing away from the respective edge, the space $S_V'$ after bonding process is about equal to or slightly smaller than $S_V$ described above. Shorting between $B_{N1}$ and $B_{N3}$ or between $B_{N2}$ and $B_{N4}$ is not a concern. In some embodiments, $P_L$ and $P_W$ are equal to or greater than about 40 μm. In some embodiments, $P_L$ and $P_W$ are in a range from 40 μm to about 200 μm. In some embodiments $S_L$ and $S_W$ are equal to or greater than about 20 μm. In some embodiments, $S_L$ and $S_W$ are in a range from 20 μm to about 150 μm. In some embodiments, the ratio L/W is larger than 1, such as great than about 1.05. In some embodiments, L/W is in a range from about 1.1 to about 1.5.

Figure 4:
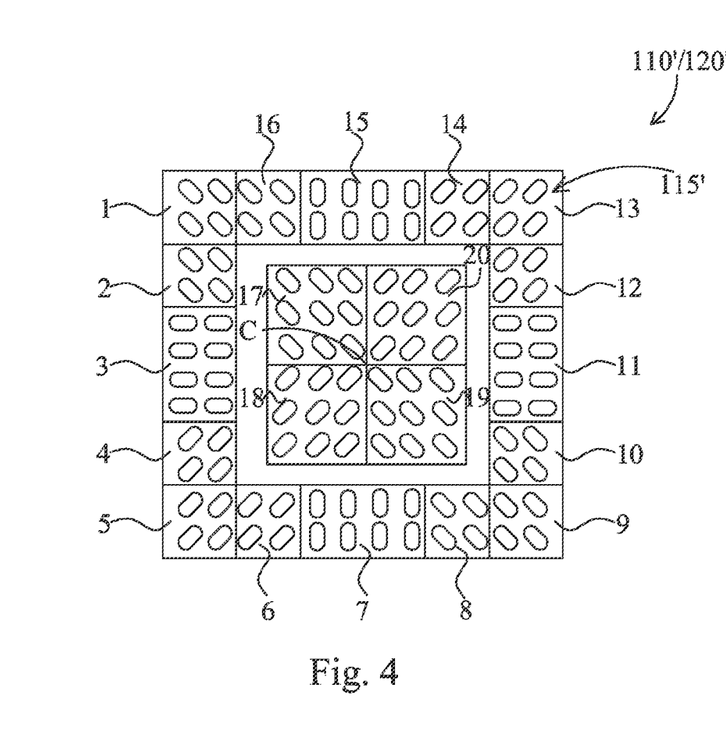
FIG. 4 shows an arrangement of groups of bonded structures, in accordance with some embodiments.

FIGS. 3B-3D described above involve elongated SRO 117'. However, elongated gated copper posts 112' could be bonded to SRO 117 (round shape). The embodiments shown in FIGS. 3A-3D involve placing neighboring bonded structures 115' within a group to be aligned with parallel axes, such as axes $Y_1$ and $Y_2$. There are many groups of bonded structures 115' on packaged structure (110'/120'). FIG. 4 shows an arrangement of groups of bonded structures, in accordance with some embodiments. The bonded structures are divided into 20 groups, as shown in FIG. 4. The elongated bonded structures in each group have axes pointed toward substantially toward the center C of the packaged structure 400. The axes of bonded structures in each group are substantially parallel. The 20 groups in FIG. 4 is merely an example. Other arrangements of groups are also possible.

In addition, FIG. 3B shows that the ends (or tips), such as $T_1$ and $T_2$, of bonded structures 115' are aligned to have a line $X_1$ connecting $T_1$ and $T_2$ substantially perpendicular (or at 90°) to axes $Y_1$ and $Y_2$. FIG. 3B shows that the widest areas $W_{N4}$ and $W_{N3}$ of bonded structures $B_{N4}$ and $B_{N3}$ respectively are substantially aligned. The widths $W_W$ of the widest areas is larger than width W due to protruding solder layer 220'.

Figure 5:
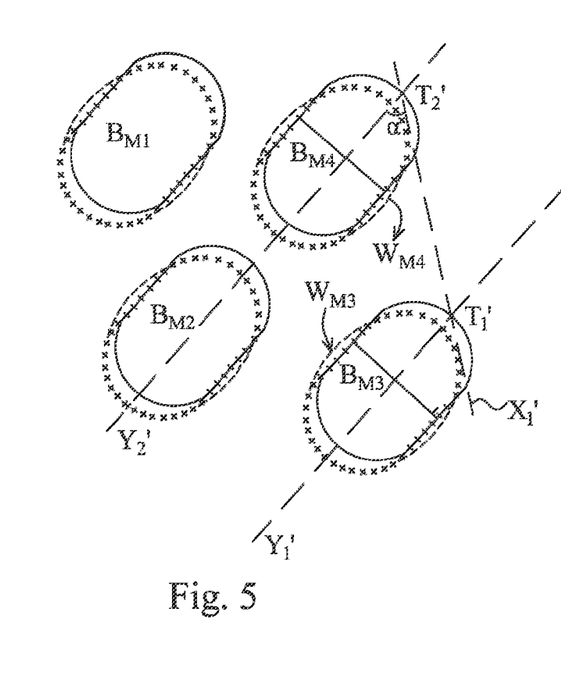
FIG. 5 shows a top view of four neighboring bonded structures, in accordance with some embodiments.

However, the line connecting the ends of the bonded structures 115' could be at an angle from the axes. FIG. 5 shows a top view of bonded structures 115'', $B_{M1}$, $B_{M2}$, $B_{M3}$, and $B_{M4}$, in accordance with some embodiments. $B_{M3}$ has an axis Y1'. $B_{M2}$ and $B_{M4}$ are aligned to have an axis $Y_2'$. $Y_1'$ and $Y_2'$ are substantially parallel. A line $X_1'$ connecting ends T1' and T2', of $B_{M3}$ and $B_{M4}$ respectively, is at an angle α, from $Y_2'$ as shown in FIG. 5. In some embodiments, the angle α is less than 90°. In some embodiments, the angle α is in a range from about 30° to about 60°. When angle α is less than 90°, the widest area of a bonded structure is not aligned with that of a neighboring bonded structure. FIG. 5 shows that the widest area $W_{M4}$ of $B_{M4}$ is not aligned with the widest area $W_{M3}$ of $B_{M3}$ due to the angle α not being 90°. In contrast, the widest areas of bonded structures $B_{N3}$ and $B_{N4}$ of FIG. 3B are aligned. Such mis-alignment of widest areas of neighboring bonded structures allows the pitch $P_M$ of bonded structures of FIG. 5 to be lower than the pitch $P_W$ of FIG. 3B. In some embodiments, the angle α is about 45°. In some embodiments, the pitch $P_M$ is equal to or greater than about 20 mm. In some embodiments, $P_M$ is in a range from about 20 μm to about 150 μm. In some embodiments, the space between neighboring bumps $S_M$ is in a range from about 10 μm to about 130 μm. Therefore, the bonded structures are aligned with angle α less than 90°, in accordance with some embodiments.

In addition to expanding the space between neighboring bonded structures to reduce the chance of shorting, elongated bonded structures arranged with axes substantially pointed to the center of packaged structures described above also reduce interfacial delamination. The bonding process could exert significant amount of stress on the bonded structures. To reduce the stress exerted on the bonded structures, an underfill is often applied between the space between package, such as package 110 or 110', and substrate, such as substrate 120 or 120', after they are bonded to support bonded structures. The underfill is made of polymers, such as resin, epoxy, or other suitable materials. In some embodiments, the underfill also includes fillers, such as silica, to adjust the mechanical strength of the underfill. The additional space between bonded structures allows the underfill to fill in the space to support the bonded structures. Further, prior to applying the underfill, the residual flux used to cover the solder layer, such as layer 113 and 220, on package or substrate, that remains on the package or substrate after they are bonded together is removed by a plasma cleaning process. The additional space between bonded structures also improves the flux cleaning process. As a result, the underfill applied can have better contact with the surface of the bonded structures, the package and the substrate. Reliability test results show fewer interfacial delamination failures for bonded structures with elongated bump structures and SROs described above in FIGS. 3A-3D and 5 compared to round structures described in FIGS. 2A-2D. Therefore, there are clear advantages of having bonded structures with elongated bump structures and SROs.

The embodiments described above provide elongated bonded structures near edges of packaged structures free of solder wetting on sides of copper posts facing substantially facing the center of the packaged structures. Solder wetting occurs on other sides of copper posts of these bonded structures. The elongated bonded structures are arranged in different arrangements and reduce the chance of shorting between neighboring bonded structures. In addition, the elongated bonded structures improve the reliability performance.

In some embodiments, a package structure is provided. The package structure includes a die package with a connecting structure including a copper post. The copper post has a first elongated cross-sectional area. The package structure also includes a substrate with a solder layer filling an opening over a metal pad, and the solder layer makes direct contact with the metal pad. The opening has a second elongated cross-sectional area, and the copper post is bonded to the solder layer to form a bonded structure. A surface of the copper post facing a center of the package structure is not wetted by the solder layer, and surface of the copper post not facing the center of the center is wetted by the solder layer.

In some embodiments, a package structure is provided. The package structure includes a plurality of bonded structures, and each of the plurality of bonded structures includes a copper post and a solder layer. The copper post is bonded to a package and the solder layer is bonded to a metal pad of a substrate, and the plurality of bonded structures are divided into a plurality of groups. The bonded structures in each of the plurality of groups have their axes parallel to one another, and their axes point substantially to a center of the package structure.

In yet some embodiments, a package structure is provided. The package structure includes a die package with a plurality of copper posts, and each of the copper post has a first elongated cross-sectional area. The package structure includes a substrate with a solder layer filling a plurality of openings over a plurality of metal pads, and the solder layer makes direct contact with the plurality of metal pads. Each of the openings has a second elongated cross-sectional area, and the plurality of copper posts are bonded to the solder layer to form a plurality of bonded structures. Edges of the plurality copper posts facing a center of the package structure are not wetted by the solder layer, and lengths of the plurality of copper posts wetted by the solder layer are less than the lengths of the plurality of copper posts.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    aligning a conductive pillar with an opening through a passivation layer, the opening exposing a conductive pad; and
    reflowing a conductive material located between the conductive pillar and the conductive pad, wherein during the reflowing the conductive material the conductive material extends up a first side of the conductive pillar more than a second side of the conductive pillar opposite the first side.

2. The method of claim 1, wherein the conductive pillar is part of a first package.

3. The method of claim 2, wherein the first package comprises a semiconductor die.

4. The method of claim 2, wherein the conductive pad is part of an interposer.

5. The method of claim 4, wherein the interposer comprises a through substrate via.

6. The method of claim 2, wherein the conductive pad is part of a second package.

7. The method of claim 1, wherein the conductive pillar comprises a metal barrier layer.

8. A method of manufacturing a semiconductor device, the method comprising:
    receiving a first package, the first package comprising:
        a first contact pad and a second contact pad over a first substrate;
        a passivation layer comprising a first portion extending from over the first contact pad to over the second contact pad;
    receiving a second package, the second package comprising a first conductive pillar with a first shape;
    aligning the first conductive pillar with an opening through the passivation layer adjacent to the first portion; and
    bonding the first conductive pillar to the first contact pad, wherein during the bonding the first conductive pillar shifts to be at least partially over the first portion of the passivation layer and wherein after the bonding the first conductive pillar has the first shape.

9. The method of claim 8, wherein the first conductive pillar comprises a metal barrier layer.

10. The method of claim 9, wherein the metal barrier layer comprises titanium.

11. The method of claim 8, wherein the first contact pad is electrically connected to a ball grid array, the ball grid array being on an opposite side of the first package from the first contact pad.

12. The method of claim 8, wherein the first shape has a first width and a first length, wherein a ratio between the first length and the first width is between about 1.1 and about 2.

13. The method of claim 12, wherein the ratio between the first length and the first width is between about 1.2 and about 1.5.

14. The method of claim 8, further comprising a second conductive pillar adjacent to the first conductive pillar, wherein a pitch between the first conductive pillar and the second conductive pillar is between about 40 μm and about 200 μm.

15. A method of manufacturing a semiconductor device, the method comprising:
    aligning a first conductive structure on a first substrate with a conductive pad on a second substrate, the first conductive structure comprising:
        a conductive pillar with a length and a width; and
        a first reflowable material; and
    bonding the first conductive structure with the conductive pad by mixing the first reflowable material with a second reflowable material to form a mixed reflowable material, wherein during the bonding the mixed reflowable material is pulled towards an edge of the first substrate such that a sidewall of the conductive pillar has a covered length equal to or less than a difference between the length and one-half of the width.

16. The method of claim 15, wherein the first conductive structure has a first shape, the first shape being a race track shape.

17. The method of claim 16, wherein an axis through the race track shape points towards a center of the first substrate.

18. The method of claim 15, wherein the first conductive structure has a first shape, the first shape being a rounded rectangle shape.

19. The method of claim 15, wherein the first substrate is part of a first package and the conductive pad is part of a second package.

20. The method of claim 19, wherein the first package has a first coefficient of thermal expansion of between about 2 ppm/° C. and about 3 ppm/° C. and the second package has a second coefficient of thermal expansion of about 17 ppm/° C.

\* \* \* \* \*